(12) United States Patent
Gassel et al.

(10) Patent No.: US 6,670,244 B2
(45) Date of Patent: Dec. 30, 2003

(54) METHOD FOR FABRICATING A BODY REGION FOR A VERTICAL MOS TRANSISTOR ARRANGEMENT HAVING A REDUCED ON RESISTIVITY

(75) Inventors: Helmut Gassel, München (DE); Werner Kanert, Holzkirchen (DE); Helmut Strack, München (DE); Franz Hirler, Isen (DE); Herbert Pairitsch, Klagenfurt (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/943,538

(22) Filed: Aug. 30, 2001

(65) Prior Publication Data

US 2002/0142527 A1 Oct. 3, 2002

Related U.S. Application Data

(63) Continuation of application No. PCT/DE00/00677, filed on Mar. 4, 2000.

(30) Foreign Application Priority Data

Mar. 4, 1999 (DE) .......................... 199 09 563

(51) Int. Cl.[7] .................. H01L 21/336; H01L 21/20
(52) U.S. Cl. .................. 438/268; 438/269; 438/222; 438/481
(58) Field of Search .................. 438/268, 142, 438/481, 273, 269, 271, 272; 257/412, 392, 396, 403, 401

(56) References Cited

U.S. PATENT DOCUMENTS 4,466,175 A * 8/1984 Coe .................. 438/273
4,608,584 A * 8/1986 Mihara .................. 257/336
4,786,952 A * 11/1988 MacIver et al. .................. 257/260
4,837,606 A   6/1989 Goodman et al.
4,862,233 A * 8/1989 Matsushita et al. .................. 257/328
4,979,001 A * 12/1990 Alter .................. 257/337
5,032,529 A * 7/1991 Beitman et al. .................. 438/212
5,160,491 A * 11/1992 Mori .................. 438/270
5,317,182 A * 5/1994 Zambrano et al. .................. 257/378
RE35,642 E * 10/1997 Frisina et al. .................. 257/327

(List continued on next page.)

FOREIGN PATENT DOCUMENTS

| EP | 1 009 036 A1 | 6/2000 |
| JP | 57-188877 A | 11/1982 |
| JP | 01-048464 A | 2/1989 |
| JP | 09-213939 A | 8/1997 |

OTHER PUBLICATIONS

Deboy et al., International Electron Devices Meeting, Technical Digest, San Francisco, Dec. 1998, pp. 683–685.

Primary Examiner—Michael S. Lebentritt
(74) Attorney, Agent, or Firm—Laurence A. Greenberg; Werner H. Stemer; Ralph E. Locher

(57) ABSTRACT

A method is provided for fabricating a body region of a first conduction type for a vertical MOS transistor configuration in a semiconductor body such that the body region has a reduced resistivity without a corresponding reduction in the breakdown voltage of the transistor. The method includes, inter alia: performing a first implantation of a doping material of a first conduction type into the semiconductor body such that an implantation maximum of the first implantation lies within the semiconductor body set back from the channel region; and performing a second implantation of a doping material of the first conduction type such that an implantation maximum of the second implantation lies within the semiconductor body below the implantation maximum of the first implantation. The dose of the second implantation is less than the dose of the first implantation.

9 Claims, 3 Drawing Sheets

U.S. PATENT DOCUMENTS

| | | | | |
|---|---|---|---|---|
| 5,675,172 A | * | 10/1997 | Miyamoto et al. | 257/402 |
| 5,731,611 A | * | 3/1998 | Hshieh et al. | 257/341 |
| 5,750,429 A | * | 5/1998 | Kushida | 438/268 |
| 5,770,503 A | * | 6/1998 | Hshieh et al. | 438/268 |
| 5,798,550 A | * | 8/1998 | Kuroyanagi et al. | 257/341 |
| 5,910,664 A | * | 6/1999 | Ajit | 257/212 |
| 6,034,398 A | * | 3/2000 | Kushida | 257/335 |
| 6,072,214 A | * | 6/2000 | Herzer et al. | 257/331 |
| 6,137,139 A | * | 10/2000 | Zeng et al. | 257/342 |
| 6,150,675 A | * | 11/2000 | Franke et al. | 257/139 |
| 6,297,101 B1 | * | 10/2001 | Schaeffer | 438/268 |
| 6,365,932 B1 | * | 4/2002 | Kouno et al. | 257/341 |

* cited by examiner

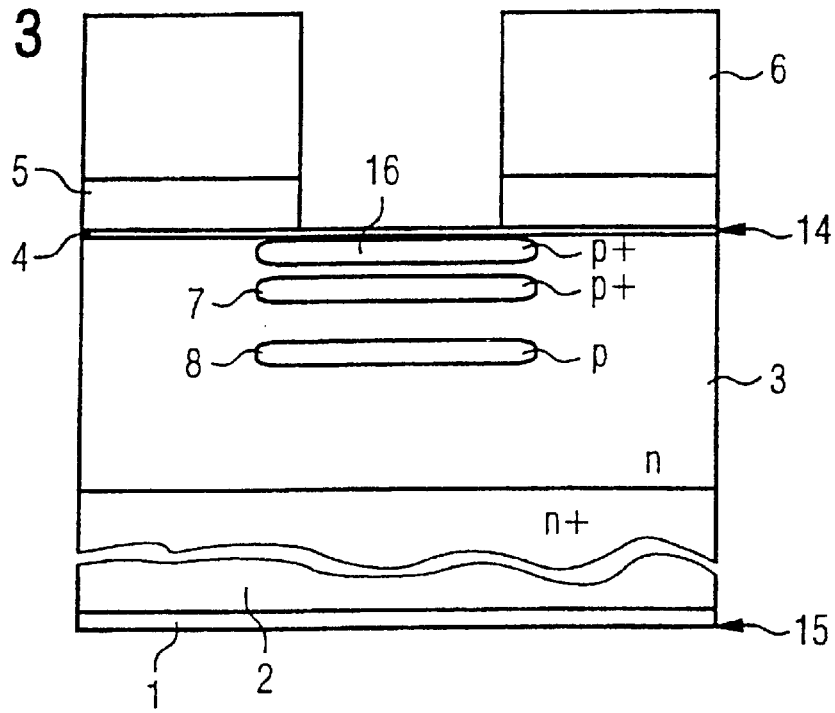
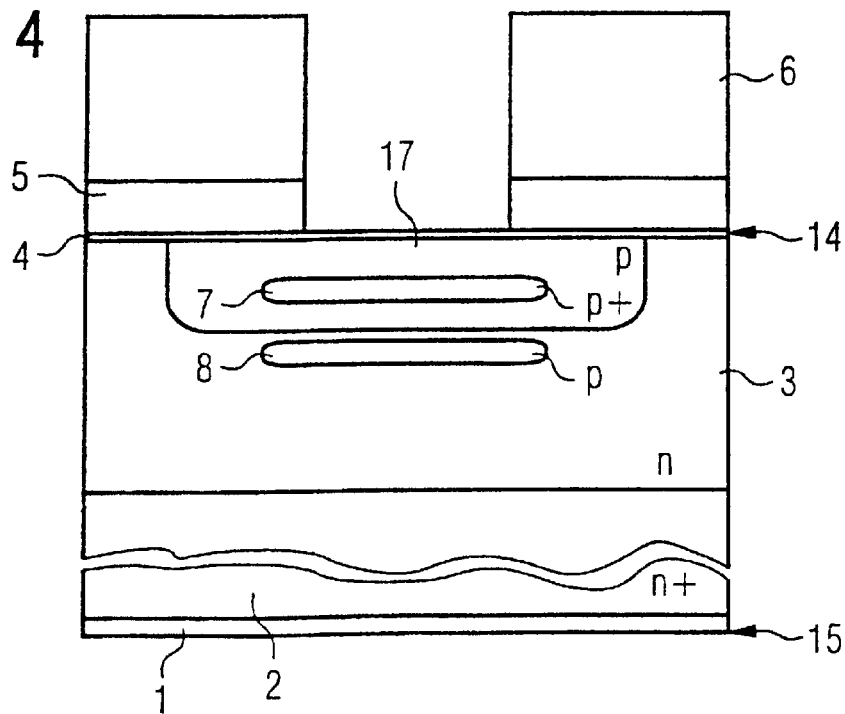

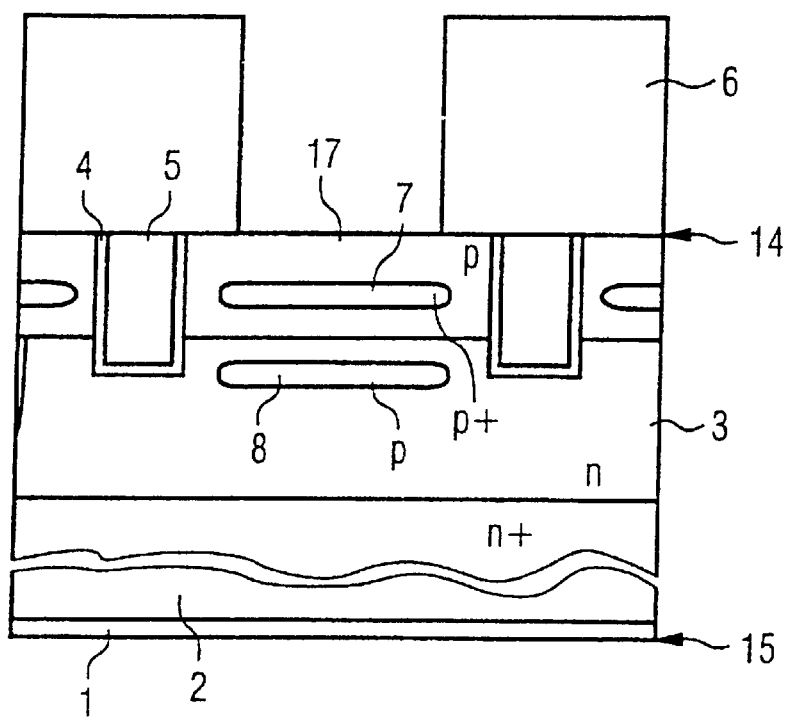
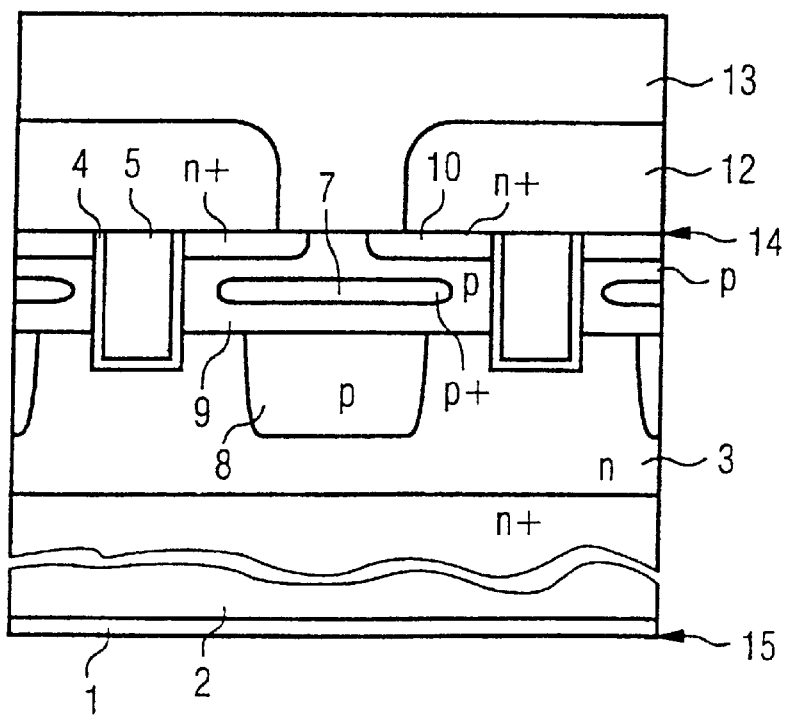

METHOD FOR FABRICATING A BODY REGION FOR A VERTICAL MOS TRANSISTOR ARRANGEMENT HAVING A REDUCED ON RESISTIVITY

This is a continuation of PCT/DE00/00677 filed Mar. 4, 2000.

BACKGROUND OF THE INVENTION

1. Field of the Invention

The present invention relates to a method for fabricating a body region for a vertical MOS transistor arrangement in a semiconductor body which has a reduced on resistivity. Shortening the channel length of the MOS structure is a significant factor for optimizing the on resistance of MOS transistor arrangements. The minimum possible channel length and thus the minimum possible channel resistance is defined by the so-called punch strength. The charge carrier concentration in the body region between the source region and the drain region must be high enough that, up to the maximum allowed drain-source voltage, the space charge zones at the pn-junctions of the source region/body region and the body region/drain region do not touch, since otherwise an impermissibly high current flows. On the other hand, however, the maximum charge carrier concentration of the body region in the channel region is defined by the threshold voltage, which is usually predetermined in customary MOS transistor arrangements.

SUMMARY OF THE INVENTION

It is an object of the present invention, therefore, to provide a method for fabricating a vertical MOS transistor arrangement whereby it is possible to achieve a reduction in the channel length of the transistor arrangement with the breakdown voltage remaining the same, and hence a reduction in the on resistivity.

A description is given of a method for fabricating a body region of the first conduction type for a vertical MOS transistor arrangement in a semiconductor body, the body region comprising at least one channel region, which is arranged between a source region of the second conduction type and a drain region of the second conduction type and adjoins a gate electrode. In this case, the body region and the source region extend from a first surface of a semiconductor body into the semiconductor body, and the drain region extends from a second surface of the semiconductor body into the semiconductor body. In this case, by way of example, the gate electrode can either be arranged on the first surface of the semiconductor body or it can also be arranged in a gate trench extending in the vertical direction from the first surface of the semiconductor body into the semiconductor body.

According to the invention, at least two implantations of a doping material of the first conduction type into the semiconductor body are carried out. The first implantation is carried out in such a way that the implantation maximum is arranged set back from the channel region. In other words, if the gate electrode of the transistor arrangement is arranged in the region of the first surface, and if the channel region thus also lies in the region of the surface, then the first implantation is carried out in such a way that the implantation maximum lies in the semiconductor body set back from the first surface. For the case of a gate electrode which is arranged in a vertical gate trench, the implantation is carried out in such a way that the implantation maximum is arranged set back in the lateral direction from the channel region which extends along the gate electrode in the vertical direction in the body region. In this case, it may also be provided at the same time that the implantation maximum is likewise arranged within the semiconductor body set back from the first surface.

A second implantation of doping material of the first conduction type is carried out in such a way that the implantation maximum of the second implantation lies in the semiconductor body below the implantation maximum of the first implantation, but the dose of the second implantation is lower than the dose of the first implantation. An outdiffusion of the implanted doping material is carried out, in which case, depending on the conditions, an outdiffusion may be provided after each individual implantation or, alternatively, an outdiffusion is carried out only after all the implantations have been carried out.

In this case, the specifications for the implantation and outdiffusion of the doping material can be set in such a way that a gradient of the doping concentration in the direction toward the channel region can be obtained in the region of the first implantation of the doping material. What can thus be achieved is that a lower concentration of the doping material and thus a lower charge carrier concentration, too, are present in the channel region, as a result of which the threshold voltage of the MOS transistor arrangement is not significantly altered. On the other hand, however, by virtue of the greater concentration of the doping material which is arranged set back from the channel region, an increase will be obtained in the charge carrier concentration in a partial region of the body region, which ensures the punch strength of the MOS transistor arrangement.

The second implantation having a lower doping concentration below the first implantation, that is to say in a region of the body region which faces the drain region and generally adjoins a drift region, has the effect that, in the off-state case of the MOS transistor arrangement, a partly mutual depletion of this region of the body region and of the adjoining drift region of the drain region can be achieved through a compensation effect. Consequently, in the case of the arrangement, it is possible to obtain an increase in the breakdown voltage. Conversely, with the breakdown voltage remaining the same, the thickness of the drift region can be reduced and the doping of the drift region can be increased, which leads to a reduction of the on resistance.

The method according to the invention thus makes it possible, in a simple manner, to produce an optimized doping profile of a body region of a vertical MOS transistor arrangement which allows a reduction of the on resistivity of the MOS transistor arrangement. Insofar as is desirable, it is also possible to achieve an increase in the breakdown voltage. In principle, it is known from the prior art, for example from U.S. Pat. No. 4,809,047 or U.S. Pat. No. 4,837,606, to carry out implantations of doping material in order to achieve a doping profile in the body region. However, these profiles are not suitable for achieving a reduction in the on resistivity and an improvement of the dielectric strength of the transistor arrangement in the manner according to the invention.

The dose of the first implantation can be chosen to be greater than the dose of the second implantation by a factor in the range from 10 to 1000. Specifically, in this case the first implantation can be chosen to be approximately a factor of 100 greater than the dose of the second implantation.

Should still further variation of the doping profile of the body region be desired, then it is possible to provide additional method steps in which doping material is introduced into the region of the body region. Thus, it may be provided that e.g. after doping material of the first conduction type has been deposited on the first surface, the doping material is diffused into the semiconductor body from the first surface in a diffusion step. What can thus be achieved is, for example, that the doping concentration can be set even more accurately in the region of the channel region, in order to set the threshold voltage of the transistor arrangement even more accurately to a desired value. Such a method step may be employed specifically when the transistor structure has a trench-type gate electrode.

It may also be provided that doping material of the first conduction type is introduced into the semiconductor body in an additional implantation step in such a way that the implantation maximum lies in the region of the channel region. The doping concentration in the channel region and thus the threshold voltage of the transistor arrangement can be influenced in a targeted manner by means of such a step. This method can be carried out in a relatively simple manner in particular when the gate electrode and thus the channel region lie in the region of the first surface of the semiconductor body. However, in principle, the invention can also be employed when a trench-type gate electrode is provided. In this case, however, it may be necessary to largely restrict the lateral extent of the implantation region in order to avoid disturbing influences on the remaining region of the transistor structure, specifically of the body region.

The dose of the third implantation may be chosen in the range from 10% to 90% of the dose of the first implantation, specifically in the range from 50% to 60% of the dose of the first implantation.

Specific examples of the method according to the invention are explained below with reference to FIGS. 1 to 6.

BRIEF DESCRIPTION OF THE DRAWINGS

FIG. 3 shows a method step in accordance with FIG. 1 with an additional, third implantation in the channel region.

FIG. 4 shows the fabrication step according to FIG. 1 with an additional indiffusion of doping material in the body region.

FIG. 5 shows the fabrication step according to FIG. 4 in the case of a vertical MOS transistor arrangement with trench-type gate electrodes.

FIG. 6 shows a diagrammatic illustration of a finished vertical MOS transistor arrangement which has been produced by means of a fabrication step according to FIG. 5.

DESCRIPTION OF THE PREFERRED EMBODIMENTS

Figure 1:
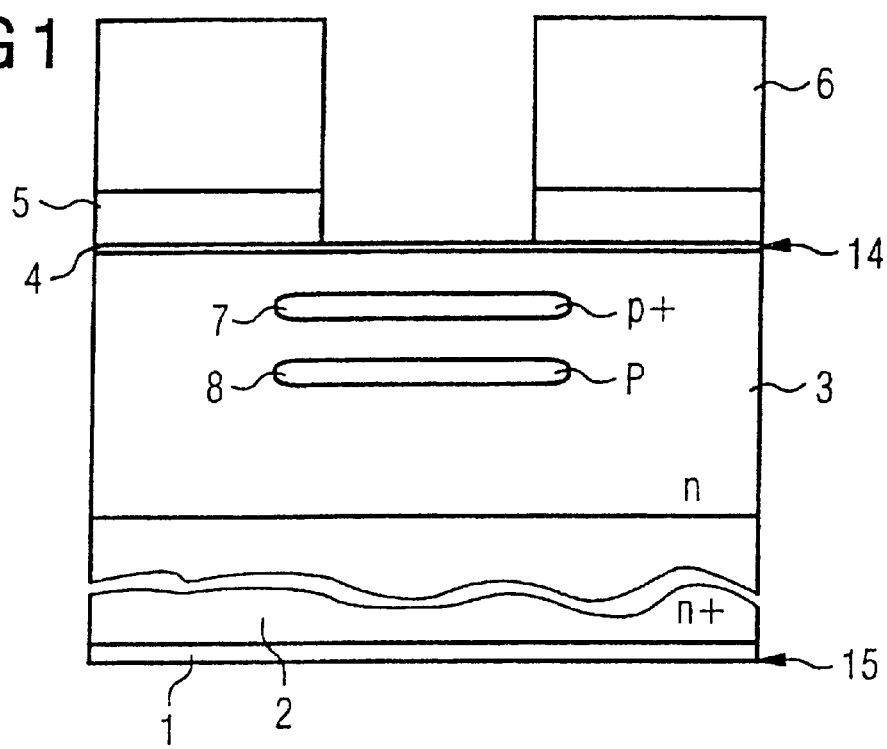
FIG. 1 shows double implantation for fabricating a body region of a vertical MOS transistor arrangement.

FIG. 1 shows, in a diagrammatic illustration, the fabrication of a body region of a vertical MOS transistor arrangement by means of a double implantation of doping material of the first conduction type, the P type in the present example. The MOS transistor arrangement has a first surface 14 and a second surface 15 has an n+-type drain zone 2 in the region of the second surface 15. A drain metalization layer 1 is applied to said second surface 15. However, it may also be provided that an additional anode zone is also provided in the region of said second surface, to which anode zone the corresponding metalization layer 1 is then applied. Such structures are apparent in particular in IGBTs (Insulated Gate Bipolar Transistors).

The drain zone 2 is adjoined by an n-type drift zone 3. The latter extends as far as the first surface 14 of the MOS transistor arrangement. A gate oxide layer 4 is applied to said first surface 14. Gate electrodes 5 are situated on said gate oxide layer 4. Said gate electrodes are masked with a photoresist 6 having openings. An implantation of P-type doping material is then performed through said openings. In this case, a first implantation 7 is carried out with a relatively high dose, which may lie for example in the region of $5 \times 10^{13}$ cm$^{-2}$. If the doping material used is boron, for example, then the implantation is carried out with an implantation energy of about 200 to 400 keV, with the result that the implantation maximum lies at a depth of about 500 nm.

Moreover, a second p-type implantation 8 is carried out, but this implantation is carried out only with a dose of about $5 \times 10^{11}$ cm$^{-2}$. For this, an implantation energy of about 1 to 2 MeV is provided for boron.

An outdiffusion of this implantation can be carried out at about 1100° C. for a period of about 50 to 100 minutes.

Figure 2:
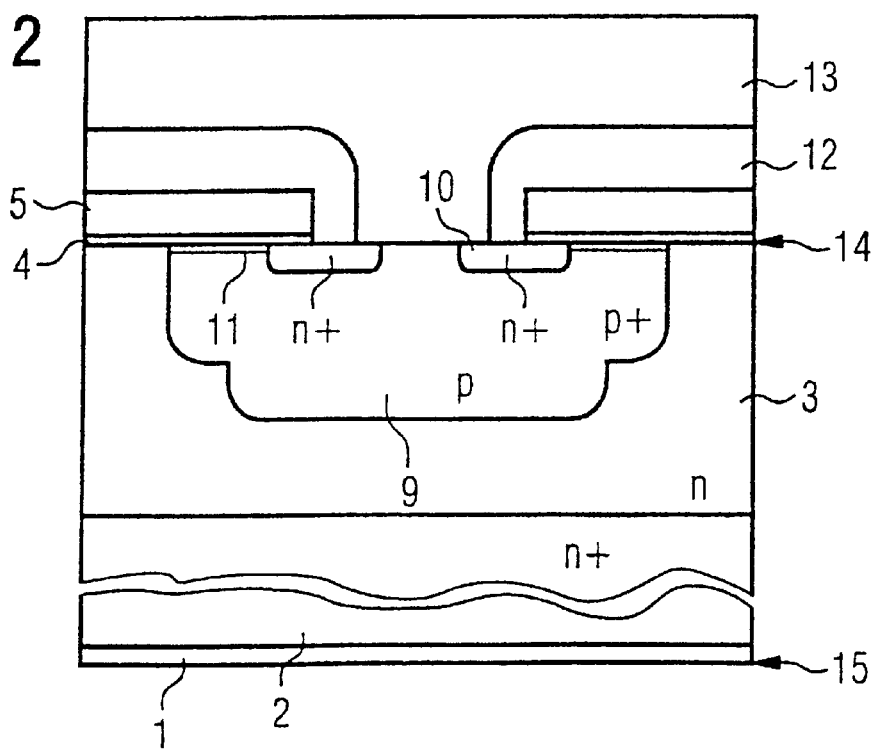
FIG. 2 shows a diagrammatic illustration of a vertical MOS transistor arrangement in which a fabrication step according to FIG. 1 was employed.

FIG. 2 diagrammatically shows a finished MOS transistor arrangement, wherein the body region 9 of this transistor arrangement can be fabricated according to a method step according to FIG. 1. It becomes clear here that the body region has a p+-type region of higher doping concentration in the region below the first surface 14, and also a p-type region of lower doping concentration which extends in the direction of the drain zone 2 and adjoins the drift region 3.

It is precisely in this lower region of the body region 9 that mutual compensation of the p-type charge carriers of the body region and of the n-type charge carriers of the drift region can be effected, with the result that these regions are mutually depleted and a largely intrinsic region is produced. In the off-state case, this region can take up a large part of the reverse voltage and makes a significant contribution to an improved dielectric strength of the MOS transistor arrangement.

In principle, the second implantation can also be dispensed with, with the result that the body region 9 is produced merely by a single implantation. Since the implantation maximum lies below the first surface 14, this automatically results in a gradient of the doping concentration toward the first surface 14, with the result that there is a lower doping concentration in the region of the channel region 11 than in the center of the body region 9.

FIG. 2 furthermore illustrates the following: The channel regions 11 in the body region 9, which are arranged between the n+-type source regions 10 and the n-type drift zone 3. A further oxide layer 12 is arranged above the gate electrodes 5. A metallization layer 13 makes contact with the n+-type source regions 10 and the p-type body region 9.

FIG. 3 largely corresponds to the method step for fabricating the body region 9 as illustrated in FIG. 1. In this case, however, an additional p+-type implantation 16 is provided in the region of the later channel region 11 of the MOS transistor arrangement. Said implantation can be carried out with a similar dose to the first implantation 7. Thus, a dose of $3 \times 10^{13}$ cm$^{-2}$, for example, is provided. The implantation energy is about 50 keV for boron. Consequently, the maximum of this additional, third implantation 16 is in very close proximity to the region of the first surface 14. This third implantation 16 is used for setting more exactly the doping concentration in the region of the channel region 11 of the MOS transistor arrangement. This may be provided in particular when boron is used as the doping material. This is because, through an outdiffusion of the first implantation 7, boron is not enriched at the interface in the region of the first surface 14. Rather, boron is more likely to exhibit the opposite behavior with regard to its segregation at interfaces. Consequently, when boron is used, it can happen that, through said outdiffusion, a doping concentration that is somewhat too low is achieved in the region of the channel region or said doping concentration cannot be set with sufficient accuracy. A third implantation may be useful, therefore, for more accurate regulation. However, if phosphorus is used as the implantation material, then the doping concentration can already be set accordingly in the channel region 11 through the first implantation 7. This is because if said first implantation is outdiffused, then the phosphorus is enriched in the region of interfaces, that is to say also in the region of the first surface 14. An additional implantation 16 may thus be dispensable, but it can likewise be provided as an additional measure for setting the threshold voltage more exactly.

Irrespective of whether or not a third implantation 16 is provided, what may be achieved, however, is that a higher doping concentration is achieved in a region of the body region 9 which is arranged set back from the channel region 11 than in the region of the channel region 11. Consequently, it is possible to increase the total charge of the body region, but at the same time the threshold voltage in the channel region can be kept largely unchanged.

FIG. 4 shows an alternative to FIG. 3, wherein a third implantation 16 is not provided, rather, e.g. after doping material has been deposited on the surface, a diffusion step is provided for producing a p-type diffusion region 17 in the region of the later body region 9. As a result, it is already possible to obtain a first background doping of the body region. In addition, the doping concentration in the channel region 11 can also be set more exactly through this diffusion region 17.

FIG. 5 shows the application of an analogous method step to FIG. 4 in the case of a MOS transistor arrangement having trench-type gate electrodes 5. In this case, a p-type diffusion region 17 has already been produced between the gate electrodes 5 in a diffusion step. A first implantation 7 is subsequently carried out, the implantation maximum of which lies in the region of the diffusion region 17. The implantation maximum of the second implantation 8 lies below the diffusion region 17. The implantations 7 and 8 are out-diffused in one or more further diffusion steps, thereby producing a structure according to FIG. 6. The finished body region 9 thus has a more lightly doped p-type region 8 which extends in the direction toward the drain zone 2 and adjoins the drift region 3. In this region, an increased voltage take-up of the MOS transistor arrangement can be achieved by means of charge carrier compensation with the drift region 3, and, consequently, mutual depletion of these regions. Conversely, given the same dielectric strength, the channel length can be reduced. In addition, the body region 9 has a largely central $p^{30}$-type region 7, which contributes to an increase in the total number of charge carriers in the body region and thus to an increased punch strength of the MOS transistor arrangement. This hardly affects the channel region 11, however, with the result that the threshold voltage is not significantly influenced.

In principle, it is also possible, if necessary, to provide for the region 8 of the body region 9, however, a higher doping concentration as well, thereby producing a $p^+$-type region, in order, for example, to prevent an avalanche breakdown in the region of the gate oxide and to concentrate this on the region 8, in order that possible destruction of the gate oxide is avoided.

In all the arrangements, by means of the method described, then, with the dielectric strength and punch strength remaining the same or even being increased, the MOS channel of the transistor arrangement can be shortened and the on resistance can thus be reduced.

We claim:
1. A method for fabricating a body region of a first conduction type for a vertical MOS transistor configuration in a semiconductor body, the method which comprises:
   providing a body region having at least one channel region configured between a source region of a second conduction type and a drain region of the second conduction type and configuring the channel region to adjoin a gate electrode;
   configuring the body region and the source region to extend from a first surface into a semiconductor body;
   configuring the drain region to extend from a second surface into the semiconductor body;
   performing a first implantation of a doping material of a first conduction type into the semiconductor body such that an implantation maximum of the first implantation lies within the semiconductor body set back from the channel region;
   performing a second implantation of a doping material of the first conduction type such that an implantation maximum of the second implantation lies within the semiconductor body below the implantation maximum of the first implantation;
   performing an outdiffusion of the doping material; and
   performing the first implantation with a dose that is from 10 to 1000 times greater than a dose of the second implantation.
2. The method according to claim 1, wherein the dose of the first implantation is 100 times greater than the dose of the second implantation.
3. The method according to claim 2, which comprises:
   after doping material of the first conduction type has been deposited on the first surface, performing an additional diffusion step to diffuse the doping material from the first surface into the semiconductor body.
4. The method according to claim 1, which comprises:
   after doping material of the first conduction type has been deposited on the first surface, performing an additional diffusion step to diffuse the doping material from the first surface into the semiconductor body.
5. A method for fabricating a body region of a first conduction type for a vertical MOS transistor configuration in a semiconductor body, the method which comprises:
   providing a body region having at least one channel region configured between a source region of a second conduction type and a drain region of the second conduction type and configuring the channel region to adjoin a gate electrode;
   configuring the body region and the source region to extend from a first surface into a semiconductor body;
   configuring the drain region to extend from a second surface into the semiconductor body;
   performing a first implantation of a doping material of a first conduction type into the semiconductor body such that an implantation maximum of the first implantation lies within the semiconductor body set back from the channel region;
   performing a second implantation of a doping material of the first conduction type such that an implantation maximum of the second implantation lies within the semiconductor body below the implantation maximum of the first implantation;
   performing the second implantation with a lower dose than a dose of the first implantation;
   performing an outdiffusion of the doping material; and
   performing an additional implantation of a doping material of the first conduction type into the semiconductor body such that an implantation maximum of the additional implantation lies near the channel region.

6. The method according to claim 5, wherein the dose of the first implantation is from 10 to 1000 times greater than the dose of the second implantation.

7. The method according to claim 6, wherein the dose of the first implantation is 100 times greater than the dose of the second implantation.

8. The method according to claim 5, wherein a dose of the additional implantation amounts to 10% to 90% of the dose of the first implantation.

9. The method according to claim 8, wherein the dose of the additional implantation amounts to 50% to 60% of the dose of the first implantation.

* * * * *

UNITED STATES PATENT AND TRADEMARK OFFICE
CERTIFICATE OF CORRECTION

PATENT NO. : 6,670,244 B2
DATED : December 30, 2003
INVENTOR(S) : Helmut Gassel et al.

It is certified that error appears in the above-identified patent and that said Letters Patent is hereby corrected as shown below:

<u>Title page,</u>
Item [63], should read as follows:

-- Continuation of application No. PCT/DE00/00677, filed on Mar. 3, 2000. --

Signed and Sealed this

Sixteenth Day of March, 2004

JON W. DUDAS
*Acting Director of the United States Patent and Trademark Office*